(12) United States Patent
Akarvardar et al.

(10) Patent No.: US 9,564,486 B2
(45) Date of Patent: Feb. 7, 2017

(54) SELF-ALIGNED DUAL-HEIGHT ISOLATION FOR BULK FINFET

(71) Applicants: International Business Machines Corporation, Armonk, NY (US); GLOBALFOUNDRIES Inc., Grand Cayman (KY); RENESAS ELECTRONICS CORPORATION, Tokyo (JP)

(72) Inventors: Murat Kerem Akarvardar, Albany, NY (US); Steven John Bentley, Albany, NY (US); Kangguo Cheng, Schenectady, NY (US); Bruce B. Doris, Slingerlands, NY (US); Jody Fronheiser, Albany, NY (US); Ajey Poovannummoottil Jacob, Albany, NY (US); Ali Khakifirooz, Los Altos, CA (US); Toshiharu Nagumo, Sagamihara (JP)

(73) Assignees: International Business Machines Corporation, Armonk, NY (US); GLOBALFOUNDRIES INC., Grand Cayman (KY); RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/839,378

(22) Filed: Aug. 28, 2015

(65) Prior Publication Data
US 2015/0372080 A1    Dec. 24, 2015

Related U.S. Application Data

(62) Division of application No. 14/083,571, filed on Nov. 19, 2013, now Pat. No. 9,324,790.

(51) Int. Cl.
H01L 27/092    (2006.01)
H01L 29/06    (2006.01)
(Continued)

(52) U.S. Cl.
CPC ..... H01L 29/0653 (2013.01); H01L 21/76229 (2013.01); H01L 21/823431 (2013.01);
(Continued)

(58) Field of Classification Search
CPC .... H01L 29/06; H01L 29/0653; H01L 27/092; H01L 27/0924; H01L 21/76229; H01L 21/823431; H01L 21/823481; H01L 27/0886; H01L 29/0649; H01L 29/785
See application file for complete search history.

(56) References Cited

U.S. PATENT DOCUMENTS 7,994,020 B2    8/2011    Lin et al.
8,941,156 B2    1/2015    Bergendahl et al.
(Continued)

*Primary Examiner* — Fazli Erdem
(74) *Attorney, Agent, or Firm* — Scully, Scott, Murphy & Presser, P.C.; Steven J. Meyers

(57) ABSTRACT

A method of forming a semiconductor structure includes forming a first isolation region between fins of a first group of fins and between fins of a second group of fins. The first a second group of fins are formed in a bulk semiconductor substrate. A second isolation region is formed between the first group of fins and the second group of fins, the second isolation region extends through a portion of the first isolation region such that the first and second isolation regions are in direct contact and a height above the bulk semiconductor substrate of the second isolation region is greater than a height above the bulk semiconductor substrate of the first isolation region.

13 Claims, 9 Drawing Sheets

(51) Int. Cl.
*H01L 27/088* (2006.01)
*H01L 21/762* (2006.01)
*H01L 21/8234* (2006.01)
*H01L 29/78* (2006.01)

(52) U.S. Cl.
CPC .. *H01L 21/823481* (2013.01); *H01L 27/0886* (2013.01); *H01L 27/0924* (2013.01); *H01L 29/0649* (2013.01); *H01L 29/785* (2013.01)

(56) References Cited

U.S. PATENT DOCUMENTS

| | | | |
|---|---|---|---|
| 2005/0056888 A1* | 3/2005 | Youn | H01L 21/82343 257/331 |
| 2006/0134868 A1 | 6/2006 | Yoon et al. | |
| 2010/0015778 A1* | 1/2010 | Lin | H01L 21/76232 438/443 |
| 2014/0191296 A1 | 7/2014 | Bergendahl et al. | |
| 2014/0203376 A1* | 7/2014 | Xie | H01L 21/76224 257/401 |
| 2015/0017781 A1 | 1/2015 | Lin et al. | |

\* cited by examiner

SELF-ALIGNED DUAL-HEIGHT ISOLATION FOR BULK FINFET

BACKGROUND

The present disclosure generally relates to semiconductor structures, and more particularly to bulk fin field effect transistor (FinFET) devices including self-aligned isolation regions with varying depth, and a method for making the same.

Complementary metal-oxide-semiconductor (CMOS) technology is commonly used for fabricating field effect transistors (FETs) as part of advanced integrated circuits (IC), such as CPUs, memory, storage devices, and the like. As integrated circuits continue to scale downward in size, there is a growing need in CMOS technology to achieve higher device density without affecting performance and/or reliability while keeping production costs down.

With the aim of increasing device density, fin field effect transistors (FinFETs) or tri-gate structures are becoming more widely used, primarily because FinFETs offer better performance than planar FETs at the same power budget. FinFETs are three dimensional (3-D), fully depleted metal-oxide semiconductor field effect transistor (MOSFET) devices representing an important part of CMOS fabrication technology to create microelectronic devices with ever-decreasing dimensions.

FinFETs have a fin structure formed from a semiconductor substrate material. The fin forms a channel region located between a source region and a drain region. A gate structure is located over the fin enfolding the channel region. Such architecture allows for a more precise control of the conducting channel by the gate, significantly reducing the amount of current leakage when the device is in off state.

In order to keep each FinFET device electrically isolated from one another, FinFETs are generally fabricated from silicon-on-insulator (SOI) substrates. The source and drain of adjacent FinFET devices are isolated from one another in order to provide source to drain decoupling. However, the high cost of SOI substrates may potentially affect the scalability of CMOS FinFET manufacturing. Bulk silicon wafers, or bulk substrates, may offer a more cost-effective alternative to SOI substrates in FinFET manufacturing.

In bulk FinFET technology, isolation regions may be used to electrically insulate adjacent devices or to electrically separate the fins of a given device from one another. Typically, isolation regions may include at least two different depths within the bulk substrate. One shallow isolation region separating fins that belong to an individual device having a shared source and drain region, and a deeper isolation region that separates adjacent source and drain regions of different devices. Currently, this may be achieved by using two different masks, one that defines the fins and one that defines the deeper isolation region. In such an instance, the process may be prone to misalignment of lithography masks.

Typically, an upper surface of one isolation region, for example, a shallow isolation region may be substantially flush with an upper surface of another isolation region, for example, a deep isolation region. This may hinder several processing steps, such as, for example chemical mechanical polish of gate structures and epi isolation.

SUMMARY

The ability to manufacture devices including two self-aligned isolation regions having different depth and different height may facilitate advancing the capabilities of current bulk FinFET technology.

According to an embodiment of the present disclosure, a method of forming a semiconductor structure includes: forming a first isolation region between fins of a first group of fins and between fins of a second group of fins. The first a second group of fins are formed in a bulk semiconductor substrate. A second isolation region is formed between the first group of fins and the second group of fins, the second isolation region extends through a portion of the first isolation region such that the first and second isolation regions are in direct contact and a height above the bulk semiconductor substrate of the second isolation region is greater than a height above the bulk semiconductor substrate of the first isolation region.

According to another embodiment of the present disclosure, a method of forming a semiconductor structure includes: forming a first group of fins and a second group of fins in a bulk semiconductor substrate, the first group of fins and the second group of fins are separated by a gap. A first dielectric layer is conformally deposited on the bulk semiconductor substrate above the first and second group of fins; the first dielectric layer substantially fills a space between each individual fin of the first and second group of fins. A dummy material is deposited above the first dielectric layer within a recess located in the gap. A portion of the first dielectric layer is removed selective to the first and second group of fins and selective to the dummy material to expose an upper portion of the first and second group of fins. A protective material is deposited above an exposed upper portion of the first and second group of fins; the protective material substantially fills the space between each individual fin of the first and second group of fins. The dummy material is removed from the recess. A portion of the first dielectric layer and a portion of the bulk semiconductor substrate are removed to form an extended recess into the bulk semiconductor substrate. A second dielectric layer is deposited to substantially fill the extended recess and the protective material is removed from above the first and second group of fins.

According to another embodiment of the present disclosure, a semiconductor structure includes: a first isolation region located between fins of a first group of fins and between fins of a second group of fins, the first and second group of fins are formed in a bulk semiconductor substrate and a second isolation region between the first group of fins and the second group of fins. The second isolation region extends through a portion of the first isolation region such that the first and second isolation regions are in direct contact and a height above the bulk semiconductor substrate of the second isolation region is greater than a height above the bulk semiconductor substrate of the first isolation region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessary obscuring the presented embodiments.

The present disclosure generally relates to semiconductor structures, and more particularly to bulk fin field effect transistor (FinFET) devices having isolation regions. The ability to improve the formation of isolation regions within bulk FinFET devices may enhance device performance and reduce overall FinFET manufacturing costs. One way to improve the formation of isolation regions in bulk FinFET devices may include forming multiple self-aligned isolation regions at different depths and different heights within a bulk semiconductor substrate. One embodiment by which to fabricate multiple self-aligned isolation regions at different depths and different heights is described in detail below by referring to the accompanying drawings in FIGS. 1-9.

Figure 1:
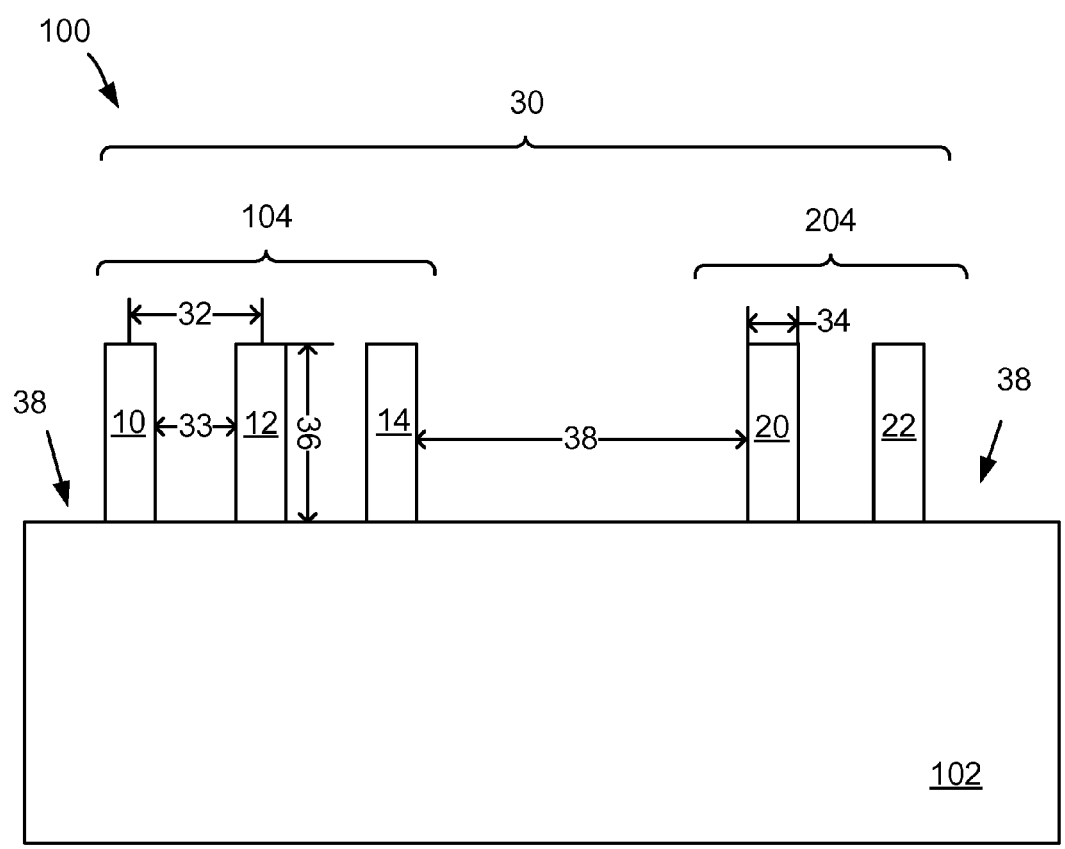
FIG. 1 is a cross-sectional view of a semiconductor structure depicting a plurality of fins formed on a bulk semiconductor substrate, according to an embodiment of the present disclosure.

Referring now to FIG. 1, a semiconductor structure 100 is shown at an intermediate step during a FinFET manufacturing process. At this step the semiconductor structure 100 may include a plurality of fins 30 (hereinafter "fins") formed from a bulk semiconductor substrate 102.

The bulk semiconductor substrate 102 may include a bulk silicon substrate having a thickness of several hundred microns. For example, the bulk semiconductor substrate 102 may include a thickness ranging from 0.5 mm to about 1.5 mm. Generally, the bulk semiconductor substrate 102 may include several n-doped or p-doped semiconductor regions (not shown).

The fins 30 may be patterned and formed from the bulk semiconductor substrate 102 by any suitable method known in the art. For example, the fins 30 may be formed by a sidewall image transfer (SIT) technique. The fins 30 may include any number of fins with a minimum of two fins. The fins 30 may include a uniform width 34 (hereinafter "fin width"), a uniform height 36 (hereinafter "fin height"), a uniform distance 33 (hereinafter "fin spacing") between fins and a uniform pitch 32 (hereinafter "fin pitch"). The fin pitch 32 may be measured from a centerline of one fin to another. The fin pitch may be determined by the sum of the fin spacing 33 and the fin width 34.

In an exemplary embodiment of the present disclosure, the fin width 34 may range from about 5 nm to about 20 nm, the fin height 36 may range from about 40 nm to about 150 nm, the fin spacing 33 may range from about 20 nm to about 40 nm, and the fin pitch 32 may range from about 30 nm to about 50 nm.

The fins 30 may include a first group of fins 104 and a second group of fins 204.

In some embodiments, the first group of fins 104 and the second group of fins 204 may include a similar number of fins or a different number of fins. For illustration purposes only, without intent of limitation, in FIG. 1 the first group of fins 104 may include fins 10, 12, and 14 and the second group of fins 204 may include fins 20 and 22.

In one embodiment of the present disclosure, the distance between any two adjacent groups of fins within the semiconductor substrate 102 may be determined by a gap 38. For example, the first group of fins 104 and the second group of fins 204 may be separated by the gap 38. More specifically, the gap 38 is defined as the distance between fin 14 in the rightmost part of the first group of fins 104 and fin 20 in the leftmost part of the second group of fins 204. Although, the gap 38 may also be defined as the distance between the first group of fins 104 and a different adjacent group of fins (not shown) located within the semiconductor substrate 102. Similarly, the gap 38 may also be defined as the distance between the second group of fins 204 and another adjacent group of fins (not shown) located within the semiconductor substrate 102.

The gap 38 may be larger than the fin spacing 33. The gap 38 may represent a space substantially equal to the space that may be occupied by at least one absent fin with substantially the same dimensions as the fins 30. In some embodiments, the gap 38 may represent a larger space equivalent to more than one absent fin. In one embodiment, the gap 38 may be at least 30 nm.

It should be noted that while this description refers to some components of the semiconductor structure 100 in the singular tense, more than one component may be depicted throughout the figures and like components are labeled with like numerals.

Figure 2:
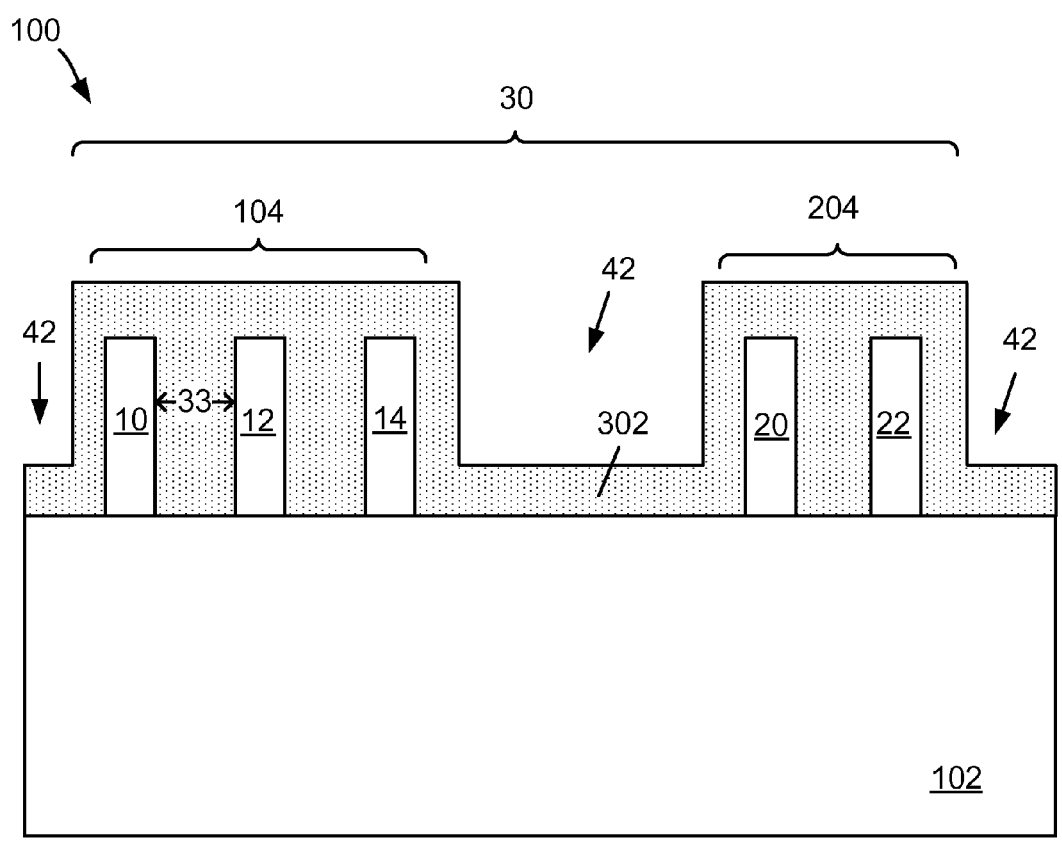
FIG. 2 is a cross-sectional view of a semiconductor structure depicting the deposition of a first dielectric layer above the bulk semiconductor substrate, according to an embodiment of the present disclosure.

Referring now to FIG. 2, a first dielectric layer 302 may be deposited on the semiconductor structure 100. The first dielectric layer 302 may be deposited by means of any deposition method known in the art, for example, by atomic layer deposition (ALD) or chemical vapor deposition (CVD) of a dielectric material. More specifically, the first dielectric layer 302 may include conformal deposition of any of several known dielectric materials above the bulk semiconductor substrate 102 and above the fins 30. Non-limiting examples of dielectric materials include: oxides, nitrides and oxynitrides of silicon. Oxides, nitrides and oxynitrides of other elements may also be envisioned.

The first dielectric layer 302 may have a thickness such that the fin spacing 33 may be substantially filled. Preferably, the thickness of the first dielectric layer 302 may be equivalent to at least half of the fin spacing 33. Since the gap 38 (shown in FIG. 1) may be larger than the fin spacing 33, depositing the first dielectric layer 302 with a thickness equivalent to half the fin spacing 33 may fill the space between two adjacent fins and create a conformal contour in the gap 38. For example, in one embodiment, the fin spacing 33 between fin 10 and fin 12 may be approximately 30 nm, and then the thickness of the first dielectric layer 302 may be approximately at least 15 nm.

In one embodiment, the first dielectric layer 302 may substantially fill the space between fin 20 and fin 22 of the second group of fins 204 and may partially fill the gap 38 (shown in FIG. 1). Further, the first dielectric layer 302 may be conformally deposited between two groups of fins, such as the first and second group of fins 104, 204, to substantially cover an exposed surface of the bulk semiconductor substrate 102. The first dielectric layer 302 may delineate a contour of the gap 38 (FIG. 1) forming a recess 42 between two groups of fins and above the first dielectric layer 302.

Figure 3:
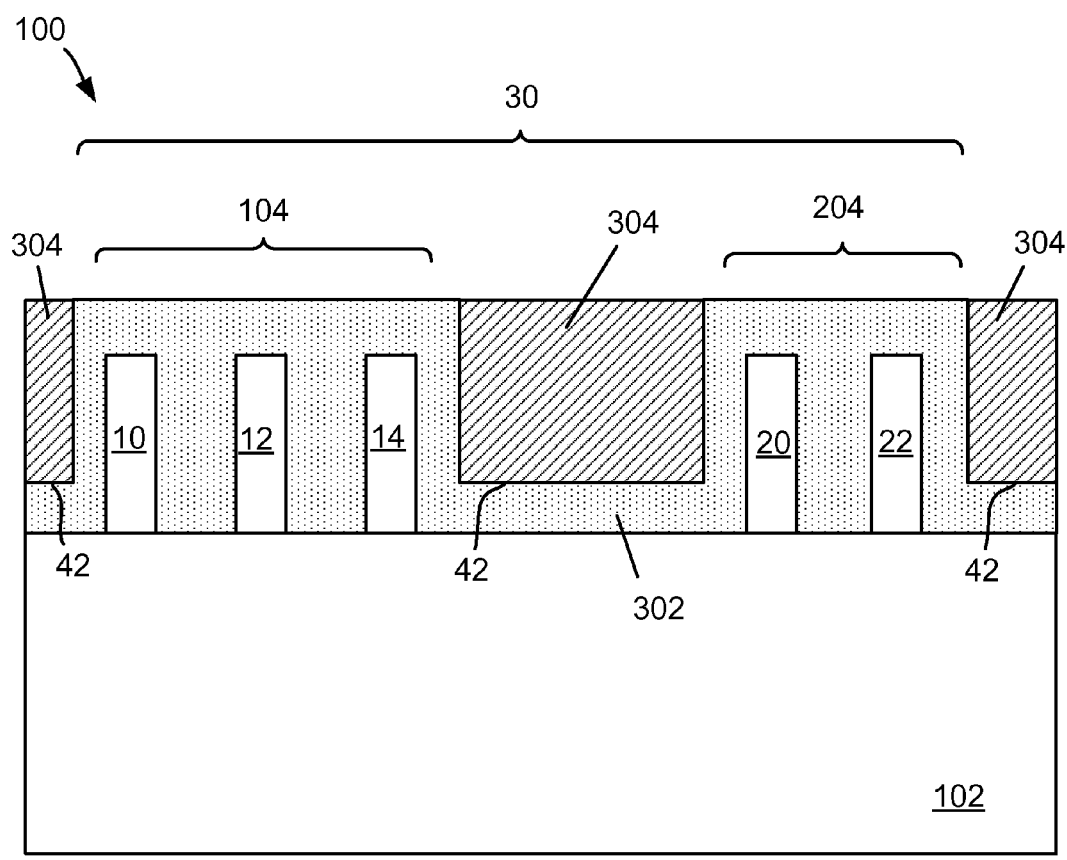
FIG. 3 is a cross-sectional view of a semiconductor structure depicting the formation of a dummy material in a recess formed between a first group of fins and a second group of fins, according to an embodiment of the present disclosure.

Referring now to FIG. 3, a dummy material 304 may be deposited in the recess 42. The dummy material 304 may be formed by any deposition method known in the art, for example, by CVD. The dummy material 304 may include any material that may allow the first dielectric layer 302 to be selectively removed. Stated differently, in a preferred embodiment, the first dielectric layer 302 and the dummy material 304 may include any two materials that may provide a fast etch rate for the material to be removed, with little or no etching of all other materials.

In one embodiment of the present disclosure, the dummy material may include an amorphous silicon (a-Si) material or an amorphous silicon-germanium material (a-SiGe) and have a thickness ranging from about 40 nm to about 150 nm.

A subsequent chemical mechanical polish (CMP) process may be conducted to remove any excess of the dummy material 304 from above a top surface of the first dielectric layer 302 to ensure a flat top surface of the first dielectric layer 302. The CMP process may stop when the top surface of the first dielectric layer 302 may be reached. The dummy material 304 may protect the recess 42 during subsequent etching of the first dielectric layer 302 as illustrated in FIG. 4.

Figure 4:
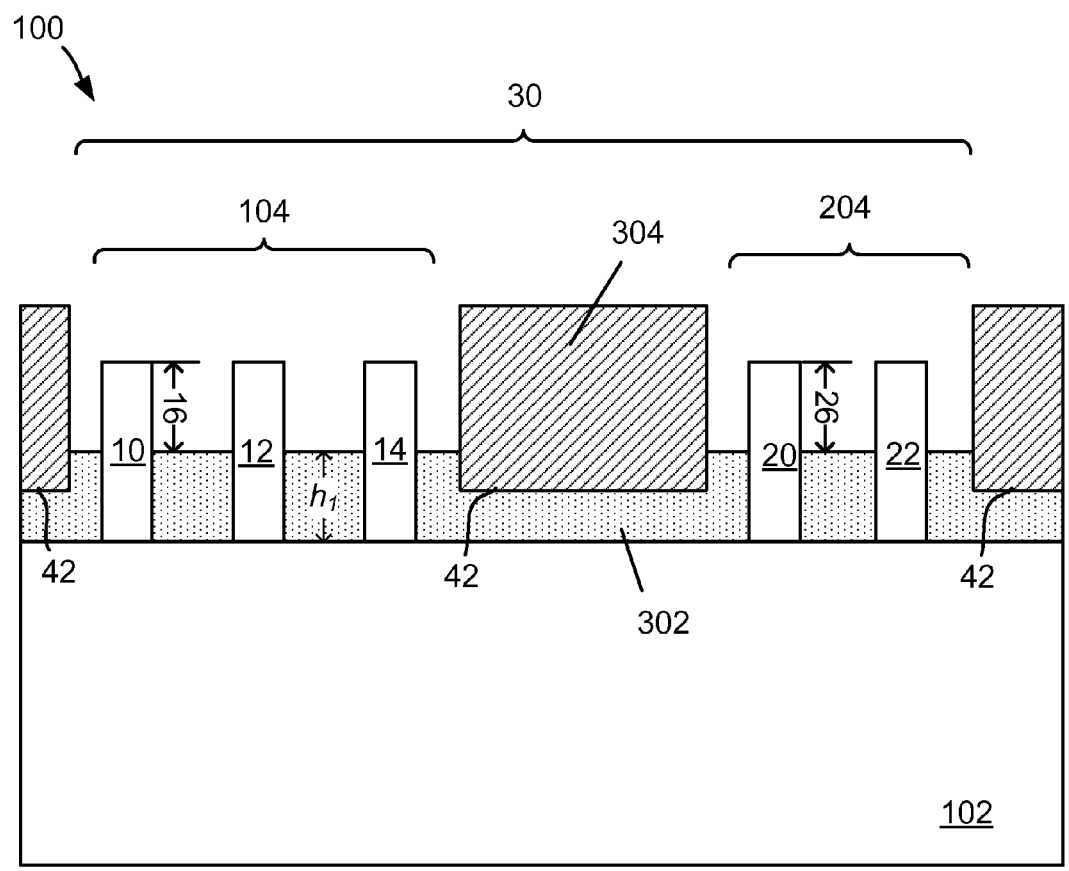
FIG. 4 is a cross-sectional view of a semiconductor structure depicting the removal of a portion of the first dielectric layer to expose a portion of the first and second group of fins, according to an embodiment of the present disclosure.

Referring now to FIG. 4, a portion of the first dielectric layer 302 may be removed to expose an upper portion 16 of the first group of fins 104 and an upper portion 26 of the second group of fins 204. The portion of the first dielectric layer 302 may be removed selective to the first and second group of fins 104, 204 and the dummy material 304 by means of any suitable etching technique. The suitable etching technique may allow for a uniform reduction of the first dielectric layer 302 such that the exposed portion 16 of the first group of fins 104 and the exposed portion 26 of the second group of fins 204 may be substantially the same. An example of a suitable etching technique may include a reactive ion etching (RIE) technique which may allow selective etching of the first dielectric layer 302 relative to the first and second group of fins 104, 204 and the dummy material 304.

The exposed portions 16, 26 of the first and second group of fins 104, 204 may define an active region in the first and second group of fins 104, 204.

In an embodiment of the present disclosure, a thickness of a remaining portion of the first dielectric layer 302 may represent a height ($h_1$) of a shallower isolation region. This shallower isolation region (hereinafter "first isolation region") may electrically separate each individual fin of the first and second group of fins 104, 204 from one another as will be discussed in detail below.

Figure 5:
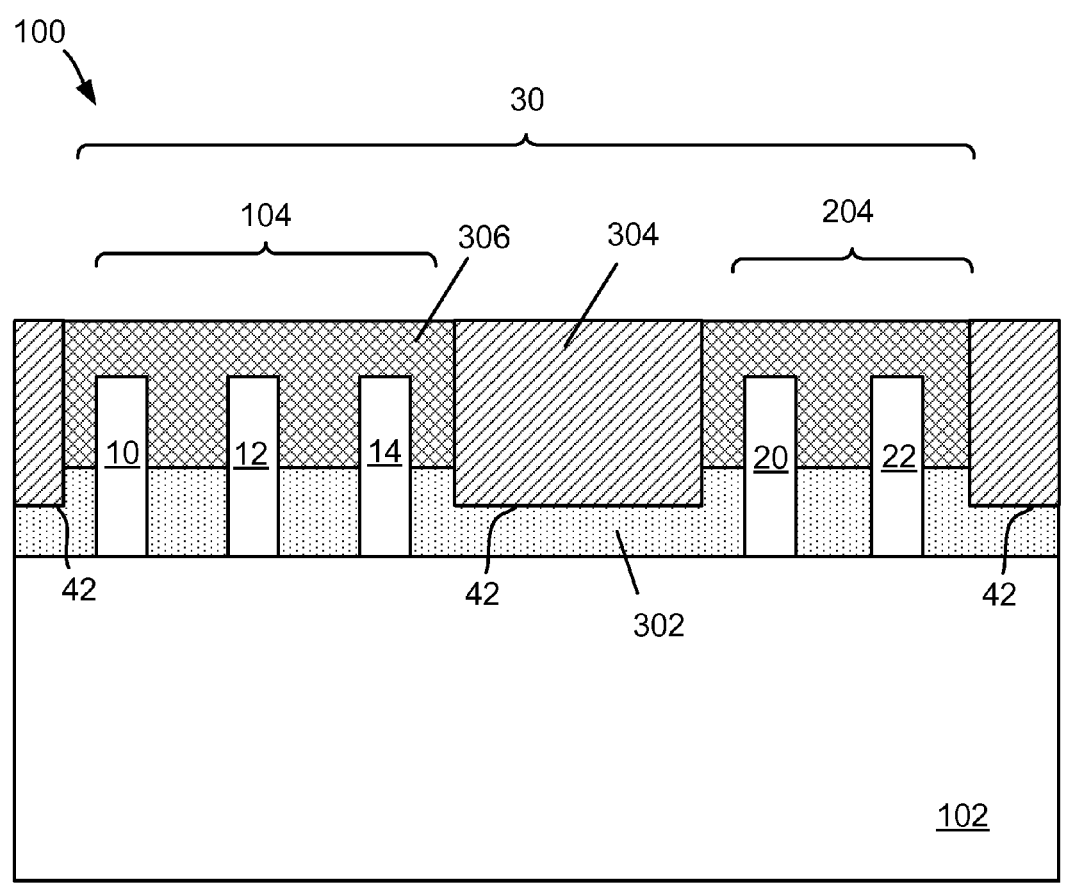
FIG. 5 is a cross-sectional view of a semiconductor structure depicting the deposition of a protective material above the first and second group of fins, according to an embodiment of the present disclosure.

Referring now to FIG. 5, a protective material 306 may be deposited above the remaining portion of the first dielectric layer 302 covering the exposed portion 16 (FIG. 4) of the first group of fins 104 and the exposed portion 26 (FIG. 4) of the second group of fins 204. The protective material 306 may be formed by any deposition method known in the art, for example, by CVD. The protective material 306 may include any material that may be subsequently removed selective to both the first dielectric layer 302 and the first and second group of fins 104, 204. In one embodiment, the protective material 306 may include silicon nitride. In one embodiment, the protective material 306 may have a thickness ranging from about 40 nm to about 100 nm.

The protective material 306 may substantially fill the space created between the first and second group of fins 104, 204 after etching of the first dielectric layer 302 described in FIG. 4. The protective material 306 may protect the first and second group of fins 104, 204 during subsequent processing steps that may require the use of different etching techniques. An example of those subsequent processing steps may include: etching of the dummy material 304 (FIG. 6), etching of the first dielectric layer 302 (FIG. 7) and etching of the bulk semiconductor substrate 102 (FIG. 7).

With continued reference to FIG. 5, a CMP process may be conducted to remove an excess of the protective material 306 from the semiconductor structure 100 such that an upper surface of the protective material 306 may be substantially flush with an upper surface of the dummy material 304.

Figure 6:
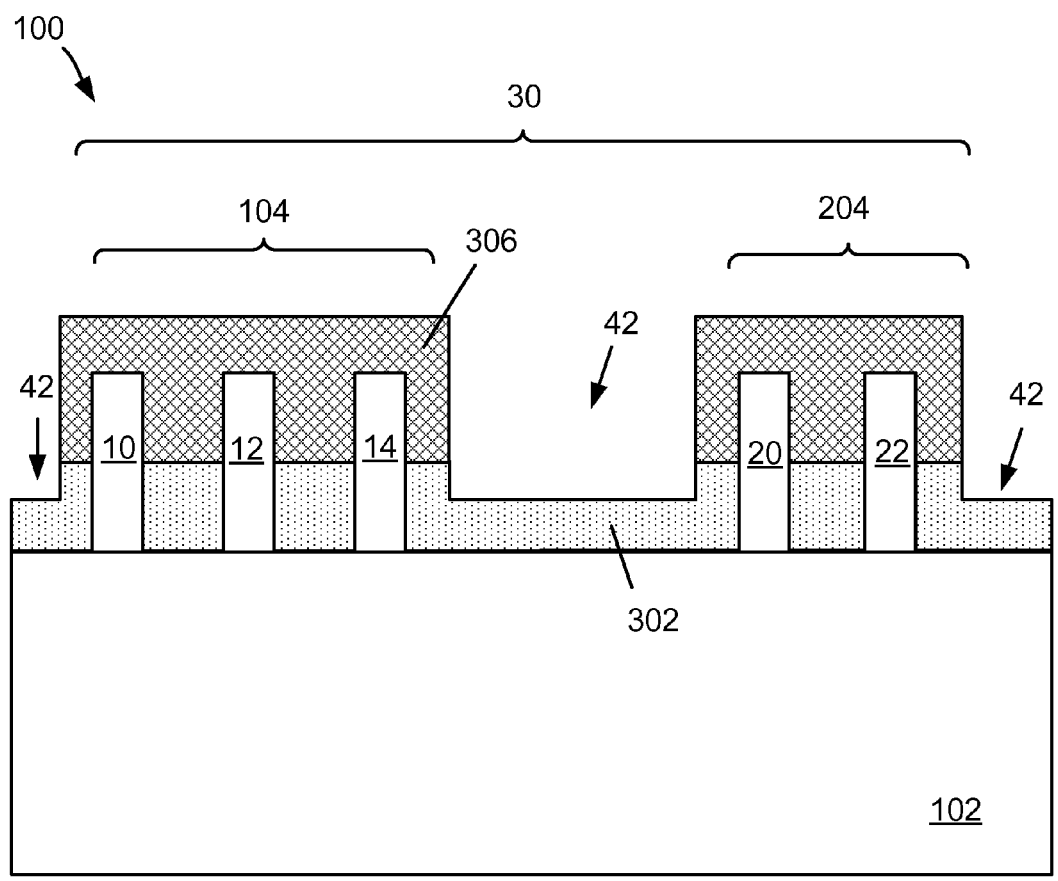
FIG. 6 is a cross-sectional view of a semiconductor structure depicting the removal of the dummy material, according to an embodiment of the present disclosure.

Referring now to FIG. 6, the dummy material 304 (FIG. 5) may be removed from the recess 42 selective to the first dielectric layer 302 and protective material 306. The dummy material may be removed by means of any suitable etching technique known in the art. Non-limiting examples of suitable etching techniques may include RIE or wet etch.

Figure 7:
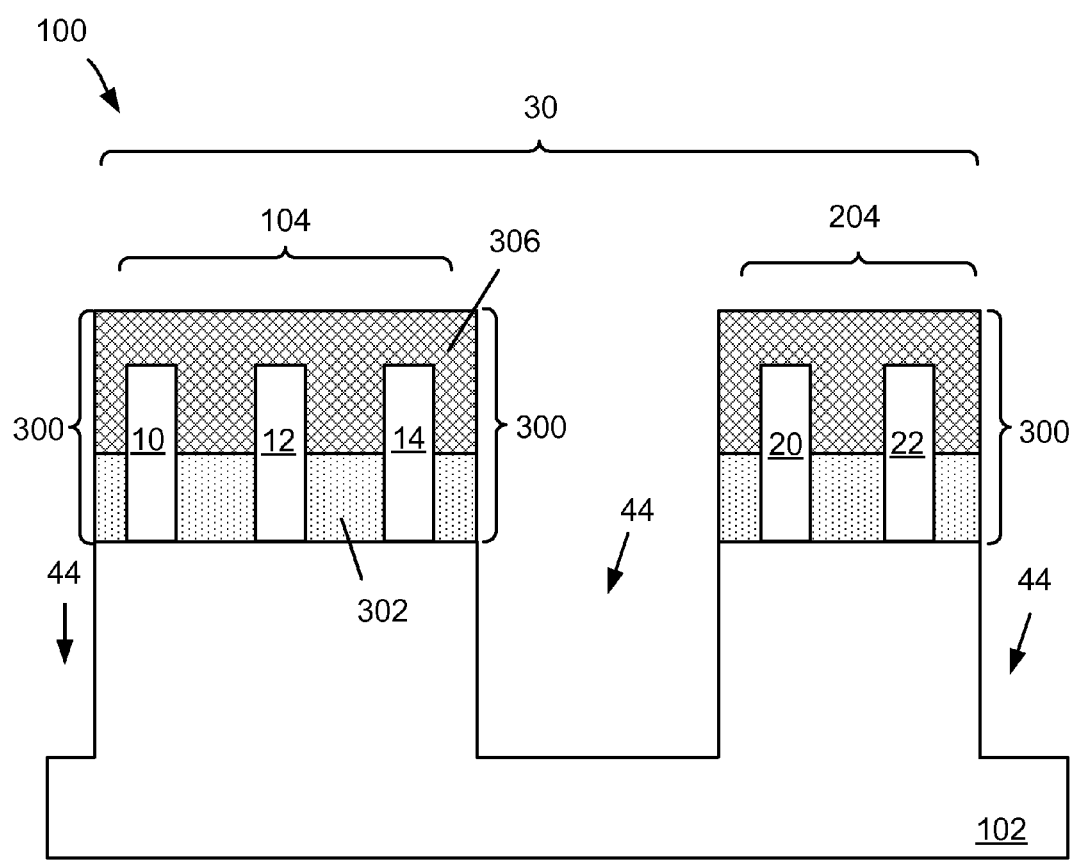
FIG. 7 is a cross-sectional view of a semiconductor structure depicting the formation of a extended recess in the bulk semiconductor substrate, according to an embodiment of the present disclosure.

Referring now to FIG. 7, a portion of the first dielectric layer 302 positioned between two groups of fins, such as the first group of fins 104 and the second group of fins 204, and below the recess 42 (FIG. 6) may be removed. In one embodiment of the present disclosure, the portion of the first dielectric layer 302 may be removed by means of a reactive ion etching (RIE) technique. Etching of first dielectric layer 302 may exposed the bulk semiconductor substrate 102.

The etch process may continue to etch the bulk semiconductor substrate 102 to form an extended recess 44 in the bulk semiconductor substrate 102. It should be noted that different etchants may be used to remove the first dielectric layer 302 and recess the bulk semiconductor substrate 102.

With continued reference to FIG. 7, the extended recess 44 may be self-aligned to sidewalls of a region 300 formed by the protective layer 306 and the first dielectric layer 302 underneath. More specifically, the remaining portion of the first dielectric material 302 and the protective material 306 may serve as a hard etch mask during etching of the bulk semiconductor substrate 102 to form the extended recess 44. The extended recess 44 may subsequently be used to form a second isolation region between the first group of fins 104 and the second group of fins 204 in the semiconductor structure 100. The extended recess 44 may have a depth ranging from about 100 nm to about 200 nm.

Figure 8:
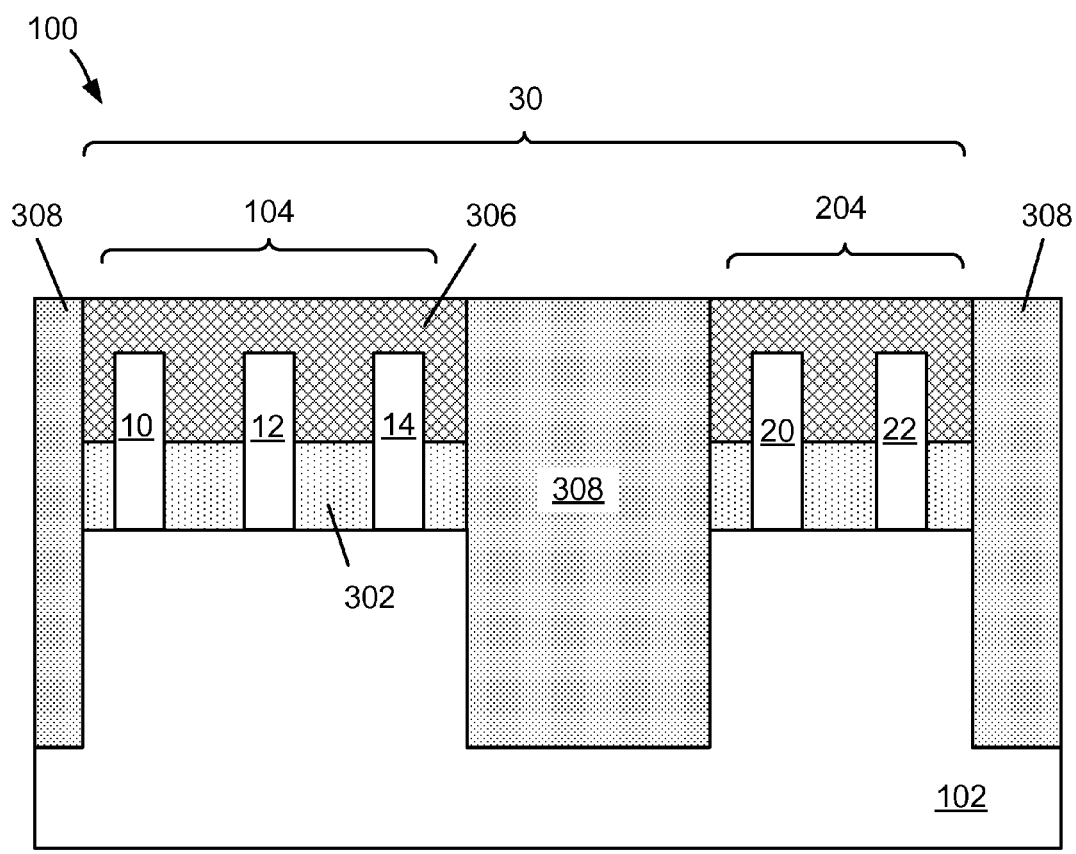
FIG. 8 is a cross-sectional view of a semiconductor structure depicting the deposition of a second dielectric material to fill the extended recess, according to an embodiment of the present disclosure.

Referring now to FIG. 8, a second dielectric layer 308 may be deposited within the extended recess 44 by means of any deposition method known in the art, for example, by chemical vapor deposition (CVD) of a dielectric material. Non-limiting examples of dielectric materials may include oxides, nitrides, and oxynitrides of silicon. Oxides, nitrides, and oxynitrides of other elements may also be envisioned. In one embodiment, the second dielectric layer 308 may have a thickness ranging from about 100 nm to about 300 nm. The second dielectric layer 308 may substantially fill the extended recess 44 (shown in FIG. 7).

The second dielectric layer 308 may form a second isolation region 504 (shown in FIG. 9) that may electrically separate the first group of fins 104 from the second group of fins 204. As will be discussed later, this second isolation region 504 may separate two subsequently formed FinFET devices located adjacent to one another within the bulk semiconductor substrate 102.

With continued reference to FIG. 8, a CMP process may be used to remove an excess of the second dielectric layer 308 from the semiconductor structure 100 such that an upper surface of the second dielectric layer 308 may be substantially flush with an upper surface of the protective material 306.

Figure 9:
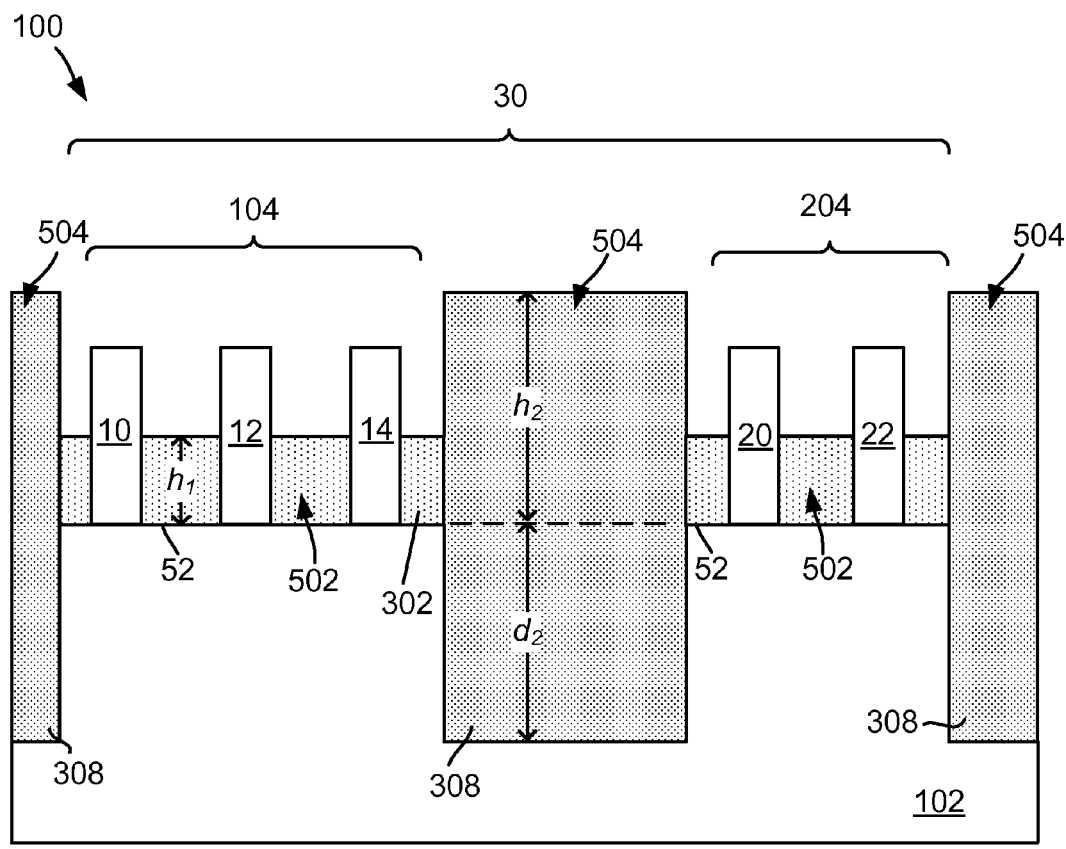
FIG. 9 is a cross-sectional view of a semiconductor structure depicting the removal of the protective material from the semiconductor structure, according to an embodiment of the present disclosure.

Referring now to FIG. 9, the protective material 306 may be removed selective to the first and second group of fins 104, 204 and the first and second dielectric layers 302, 308. Removal of the protective material 306 may be conducted in a way such that the integrity of the first and second group of fins 104, 204 may not be compromised. The protective material 306 may be selectively removed by any etching technique known in the art, for example, by a reactive ion etching (RIE) technique or a wet etch technique.

In one embodiment, for example, the protective material 306 may include silicon nitride, the first dielectric layer 302 may include silicon dioxide and the first and second group of fins 104, 204 may include silicon, in this case the silicon nitride may be removed by wet etching a hot phosphoric acid selective to the silicon dioxide and the silicon.

After removing the protective material 306, the semiconductor structure 100 may include a first isolation region 502 made from the first dielectric layer 302 and a second isolation region 504 made from the second dielectric layer 308. The first and second isolation regions 502, 504 may include different depths and different heights.

The depth and height of the first and second isolation regions 502, 504 may be defined with respect to a top surface 52 of the bulk semiconductor substrate 102. The height being a distance above the top surface 52 of the bulk semiconductor substrate 102, and the depth being a distance below a top surface 52 of the bulk semiconductor substrate 102.

In one embodiment, the first isolation region 502 has a height $h_1$ above the top surface 52 of the bulk semiconductor substrate 102; the second isolation region 504 has a height $h_2$ above the top surface 52 of the bulk semiconductor substrate 102 and a depth $d_2$ below the top surface 52 of the bulk semiconductor substrate 102. The height $h_2$ of the second isolation region 504 may be greater than the height $h_1$ of the first isolation region 502. The height $h_2$ of the second isolation region 504 may be greater than the fin height 36 (FIG. 1) of the fins 30.

In one embodiment, the second isolation region 504 may be formed self-aligned to the first group of fins 104 and the second group of fins 204. The space between the second isolation region 504 and fin 14 as well as the space between the second isolation region 504 and fin 20 may be substantially equal to half the fin spacing 33 (FIG. 1).

The first isolation region 502 may electrically separate the fins 30 from one another while the second isolation region 504 may electrically separate the first group of fins 104 from the second group of fins 204. In one embodiment, the first group of fins 104 may be part of a subsequently formed p-FET device and the second group of fins 204 may be part of a subsequently formed n-FET device, or vice versa. Such p-FET and n-FET devices may be electrically separated by the second isolation region 504.

It should be noted that, in some embodiments, additional processes during subsequent FinFET manufacturing may affect the final height of the first and second isolation regions 502, 504.

The steps described above may provide a method of forming a semiconductor structure including self-aligned isolation regions having different heights and different depths. The first isolation region may be located between each individual fin of a determined group of fins to electrically isolate each fin from one another. The second isolation region may be located between two adjacent groups of fins to electrically isolate one group of fins from the neighboring group of fins. A height and a depth of the second isolation region may be greater than a height and a depth of the first isolation region providing to each subsequently formed FinFET device enhanced device isolation and additional protection during subsequent processing steps, including CMP of gate structures and epi isolation.

Improved manufacturing of isolation regions may enhance bulk FinFET performance by reducing the current leakage between devices. Additionally, since the second isolation region is self-aligned with respect to the groups of fins, the use of additional masks to define the isolation regions may not be required hence reducing bulk FinFET manufacturing costs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a first isolation region located between fins of a first group of fins and between fins of a second group of fins, the first group of fins and the second group of fins being formed in a bulk semiconductor substrate; and
   a second isolation region between the first group of fins and the second group of fins, the second isolation region extending through a portion of the first isolation region such that the first and second isolation regions are in direct contact and a height above the bulk semiconductor substrate of the second isolation region is greater than a height above the bulk semiconductor substrate of the first isolation region, wherein the second isolation region and the first group of fins and the second group of fins are separated by a portion of the first isolation region that has a length equivalent to half the distance between two adjacent fins.

2. The semiconductor structure of claim 1, wherein the first isolation region separates each individual fin of the first group of fins and the second group of fins from one another and the second isolation region separates the first group of fins from the second group of fins.

3. The semiconductor structure of claim 1, wherein the first and second isolation regions comprise a dielectric material.

4. The semiconductor structure of claim 1, wherein the dielectric material is silicon dioxide.

5. The semiconductor structure of claim 1, wherein a topmost surface of the second isolation region is greater than a topmost surface of each of the first group of fins and the second group of fins.

6. The semiconductor structure of claim 1, wherein a topmost surface of the first isolation region is less than a topmost surface of each of the first and second fins.

7. The semiconductor structure of claim 1, wherein a bottommost surface of the first isolation region is coplanar with a bottommost surface of each of the first group of fins and the second group of fins.

8. The semiconductor structure of claim 1, wherein at least one sidewall surface of the first isolation region directly contacts a sidewall surface of one of the fins of the first group of fins or one of the fins of the second group of fins.

9. The semiconductor structure of claim 1, wherein the second isolation region has a bottommost surface that contacts a sub-surface of the bulk semiconductor substrate.

10. The semiconductor structure of claim 1, wherein the first isolation region comprises a first dielectric material and the second isolation region comprises a second dielectric material.

11. The semiconductor structure of claim 1, wherein an upper sidewall portion and a topmost surface of each fin of the first group of fins and the second group of fins are exposed.

12. The semiconductor structure of claim 11, wherein an nFET device is formed on exposed surfaces of each fin of the first group of fins and a pFET device is formed on exposed surfaces of each fin of the second group of fins.

13. The semiconductor structure of claim 11, wherein a pFET device is formed on exposed surfaces of each fin of the first group of fins and an nFET device is formed on exposed surfaces of each fin of the second group of fins.

* * * * *